United States Patent
Liu et al.

(10) Patent No.: US 9,023,226 B2
(45) Date of Patent: May 5, 2015

(54) PARTICLE SOURCES AND METHODS FOR MANUFACTURING THE SAME

(75) Inventors: Huarong Liu, Hefei (CN); Ping Chen, Hefei (CN)

(73) Assignee: 38th Research Institute, China Electronics Technology Group Corporation, Hefei, Anhui (CN)

( * ) Notice: Subject to any disclaimer, the term of this patent is extended or adjusted under 35 U.S.C. 154(b) by 0 days.

(21) Appl. No.: 13/512,396

(22) PCT Filed: May 4, 2012

(86) PCT No.: PCT/CN2012/075085
§ 371 (c)(1),
(2), (4) Date: Dec. 4, 2013

(87) PCT Pub. No.: WO2012/155791
PCT Pub. Date: Nov. 22, 2012

(65) Prior Publication Data
US 2014/0077684 A1      Mar. 20, 2014

(30) Foreign Application Priority Data
May 16, 2011    (CN) .......................... 2011 1 0137263

(51) Int. Cl.
*C25F 3/00* (2006.01)
*C03C 15/00* (2006.01)
*H01J 37/04* (2006.01)
*H01L 21/311* (2006.01)
(Continued)

(52) U.S. Cl.
CPC ........... *H01J 37/04* (2013.01); *H01L 21/31116* (2013.01); *H01J 37/073* (2013.01); *H01J 2237/0807* (2013.01); *B82Y 40/00* (2013.01); *H01J 27/26* (2013.01); *H01J 9/02* (2013.01); *H01J 9/025* (2013.01); *H01J 37/08* (2013.01);
(Continued)

(58) Field of Classification Search
None
See application file for complete search history.

(56) References Cited

U.S. PATENT DOCUMENTS 7,368,727 B2     5/2008  Ward
2007/0025907 A1*  2/2007  Rezeq et al.  ............... 423/447.3

FOREIGN PATENT DOCUMENTS

| CN | 101361154 A | 2/2009 |
| CN | 101375363 A | 2/2009 |
| CN | 101506927 A | 8/2009 |

OTHER PUBLICATIONS

Rahman et al., "Field-assisted oxygen etching for sharp field-emission tip." Surface Science, vol. 602 Issue 12, Jun. 2008, p. 2128-2134.*

(Continued)

*Primary Examiner* — Shamim Ahmed
*Assistant Examiner* — Bradford Gates
(74) *Attorney, Agent, or Firm* — Merchant & Gould P.C.

(57) ABSTRACT

The present disclosure provides a method for manufacturing a particle source comprising: placing a metal wire in vacuum, introducing active gas, adjusting a temperature of the metal wire and applying a positive high voltage V to the metal wire to generate at a side of the head of the metal wire an etching zone in which field induced chemical etching (FICE) is performed; increasing by the FICE a surface electric field at the top of the metal wire head to be greater than a field evaporation electric field of material for the metal wire, so that metal atoms at the top of the metal wire are evaporated off; after the field evaporation is activated by the FICE, causing mutual adjustment between the FICE and the field evaporation, until the head of the metal wire has a shape of combination of a base and a tip on the base; and stopping the FICE and the field evaporation when the head of the metal wire takes a predetermine shape.

18 Claims, 5 Drawing Sheets

| | | | | |
|---|---|---|---|---|
| (51) | Int. Cl. | | (56) | References Cited |
| | (2006.01) | *H01J 37/073* | | |
| | (2006.01) | *H01J 27/26* | | |
| | (2006.01) | *H01J 9/02* | | OTHER PUBLICATIONS |
| | (2006.01) | *H01J 37/08* | | |
| | (2011.01) | *B82Y 40/00* | | International Search Report for corresponding International Patent Application No. PCT/CN2012/075085 mailed Aug. 2, 2012. |
| (52) | U.S. Cl. | | | |
| | CPC .............. *H01J 2237/06341* (2013.01); *H01J 2237/2623* (2013.01) | | | * cited by examiner |

PARTICLE SOURCES AND METHODS FOR MANUFACTURING THE SAME

This application is a National Stage Application of PCT/CN2012/075085, filed 4 May 2012, which claims benefit of Serial No. 201110137263.3, filed 16 May 2011 in China and which applications are incorporated herein by reference. To the extent appropriate, a claim of priority is made to each of the above disclosed applications.

TECHNICAL FIELD

The present disclosure relates to particle sources, and in particular to particle sources for electronic microscope, focused ion beam, micro-focus X-ray tube, electron beam lithography machine, ion beam lithography machine and the like, and methods for manufacturing the particle source.

BACKGROUND

Electronic microscope, focused ion beam, micro-focus X-ray tube, electron beam lithography machine, ion beam lithography machine and the like each play an important role in current micro- and nano-science and technology.

Electron source for generating electrons and ion source for generating ions (collectively referred to as particle source, which is usually formed of a metal wire) are key components in the above-mentioned imaging systems. The performance of the particle source is ultimately important to some critical characteristics of the imaging systems, such as resolution, or contrast.

The most common electron source is Schottky field emission electron source, which has advantages including a long life time over a conventional thermal electron source. However, this electron source also has some disadvantages, such as larger virtual source diameter, lower resolution and brightness, and uneven distribution of electron energy. Cold field emission electron source is currently considered as having a better performance in that it has a smaller virtual source diameter, and provides a higher brightness at high voltages than the Schottky field emission electron source. The brightness, however, would vary dramatically at low voltages. This is not suitable for detection of many materials, particularly Biological samples, which must be detected at a low voltage, otherwise would be damaged.

Gas field ion source has been introduced for many years. It has advantages, such as smaller virtual source diameter and uniform distribution of ion energy, and also disadvantages like lower beam current density. In addition, the size of tip is limited by micro- and nano-fabrication processes, and thus the divergence angle of an ion source is too large to be applied in a focused ion beam system. Currently, the most common ion source is liquid metal ion source which has a high beam current density but a larger virtual source diameter and uneven distribution of ion energy. Recently, with successful development of pyramid atom-level tip, it is possible for Gas field ion source to be applied in focused ion beam systems. However, the shortcoming of a very low beam current density is still a restriction on application of the Gas field ion source, especially in the field of micro- and nano-manufacture.

There is thus a need for a particle source capable of providing particle beam with high current density, small beam opening angle, reduced virtual source diameter and small energy spread. It is also desirable that an electron source could emit electron beams with good spatial coherence.

SUMMARY

According to an aspect of the present disclosure, a method for manufacturing a particle source is provided comprising: placing a metal wire in vacuum, introducing active gas, adjusting a temperature of the metal wire and applying a positive high voltage V to the metal wire to generate at a side of the head of the metal wire an etching zone in which field induced chemical etching (FICE) is performed; increasing by the FICE a surface electric field at the top of the metal wire head to be greater than a field evaporation electric field of material for the metal wire, so that metal atoms at the top of the metal wire are evaporated off; after the field evaporation is activated by the FICE, causing mutual adjustment between the FICE and the field evaporation, until the head of the metal wire has a shape of combination of a base and a tip on the base; and stopping the FICE and the field evaporation when the head of the metal wire takes a predetermine shape.

In an embodiment, the positive high voltage V may enable a surface electric field at the top of the head to be greater than an ionization electric field of the active gas.

In an embodiment, the active gas may have a pressure lower than a discharge pressure of the active gas.

In an embodiment, during the FICE, the temperature of the metal wire may be controlled so that the molecules of the active gas may be absorbed to the surface of the metal wire.

In an embodiment, the FICE occurs at lateral sides of the metal wire to form the base, and the FICE and the field evaporation reduce the head of the metal wire from the lateral sides and the upper side, respectively, and then form the tip of the particle source.

In an embodiment, a migration rate of the active gas along the surface of the metal wire may be decreased by quickly lowering the temperature of the metal wire to below the boiling point of the active gas, and then the FICE and the field evaporation may be stopped by turning off the positive high voltage V.

In an embodiment, after turning off the voltage, the temperature of the metal wire may be increased to remove active gas molecules absorbed to the surface of the metal wire.

In an embodiment, the FICE and the field evaporation may be stopped by stopping introduction of the active gas.

In an embodiment, the FICE and the field evaporation may be stopped when a tip is obtained having a predetermined number of atoms at the topmost layer.

In an embodiment, after stopping the FICE and the field evaporation and discharging the active gas, another positive high voltage may be applied to activate field evaporation at the topmost layer of the surface of the tip to remove non-metal atoms or molecules absorbed at the tip, and also to selectively remove metal atoms in order to produce a tip having a predetermined number of atoms at the topmost layer, wherein the predetermined number is at least one.

In an embodiment, a micro-channel plate (MCP) and a conductive fluoroscopic screen may be positioned in this order along a direction perpendicular to an axis of the metal wire and directly facing the head of the metal wire, and imaging gas may be injected for observing states of the head of the mental wire.

In an embodiment, the particle source may be an electron source or an on source.

In an embodiment, the positive high voltage V may be constant and take a value ranging from 3 kV to 100 kV, while the FICE and the field evaporation are occurring simultaneously and adjusting each other.

In an embodiment, the metal wire may be preprocessed to have a tapered head with a tip diameter smaller than 1 μm.

In an embodiment, accuracy and speed of the FICE may be controlled b adjusting one or more of the pressure of the active gas, the temperature of the metal wire and the value of the positive high voltage V.

In an embodiment, the curvature radius of the base may be controlled by controlling the curvature radius of the tip and the value of the positive high voltage V.

In an embodiment, the active gas may be any one of $O_2$, $N_2$, CO, $CO_2$, other active gas containing oxygen or nitrogen, or combination thereof.

In an embodiment, material for the particle source may comprise any one of tungsten (W), tantalum (Ta), rhenium (Re), molybdenum (Mo), hafnium (Hf), and niobium (Nb).

According to another aspect of the present disclosure, a particle source is provided being manufactured with a method of any one of the above methods.

According to a further aspect of the present disclosure, an apparatus is provided comprising the particle source as mentioned above. The apparatus may be an electronic microscope, a focused ion beam, a micro-focus X ray tube, an electron beam lithography machine, an ion beam lithography machine and the like.

BRIEF DESCRIPTION OF THE DRAWINGS

The above features and advantages of the present disclosure will be more apparent from the following detailed description with reference to accompanying drawings. The figures are intended to be illustrating, other than limiting, the present disclosure. The figures may not be drawn to scale, and the shapes are also illustrative, other than strictly corresponding to those of products. In the figures.

DETAILED DESCRIPTION OF THE PREFERRED EMBODIMENTS

Hereafter, embodiments of the present disclosure will be described in detail with reference to the figures. It will be readily understood that the following detailed description of embodiments is not intended to illustrate other than excluding. They are intended to illustrate the principle of the present disclosure, not limit the scope of the present disclosure.

Figure 1:
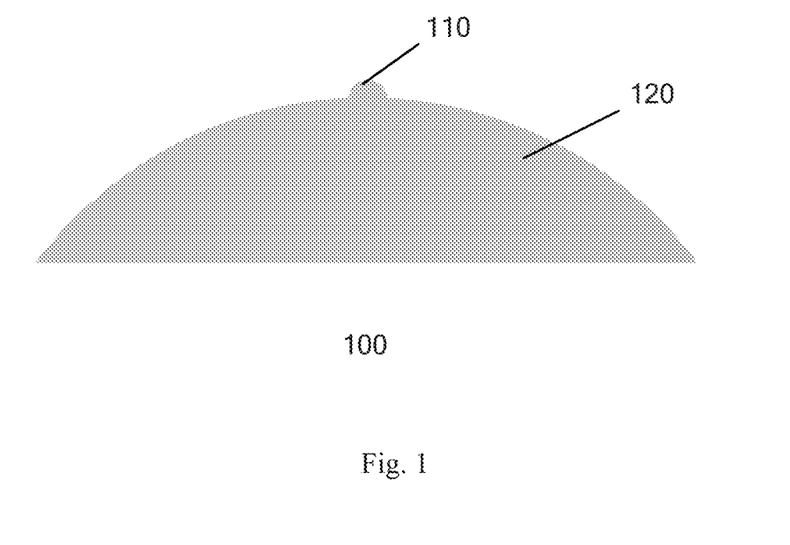
FIG. 1 shows a schematic block diagram of a particle source according to an embodiment of the present disclosure.

FIG. 1 shows a schematic block diagram of a particle source 100 according to an embodiment of the present disclosure. The particle source 100 may be used as electron or ion source.

As shown in FIG. 1, the particle source 100 may include a tip 110 and a base 120. The tip 110 may be formed as a tiny protrusion on the base 120. The curvature radius of the top of the tip 110 may be of an order ranging from sub-nanometers to tens of nanometers. There may exist at least one atom at the in topmost layer of the tip 110 top. The top of the base 120 may be formed as a gently-shaped convex, and optionally may be symmetric about a central axis of the base 120. Optionally, the curvature radius of the base 120 may be of an order ranging from tens of nanometers to micrometers. Optionally, the tip 110 may be positioned exactly at the center of the base 120. The curvature radius of the base 120 is substantially greater than that of the tip 110. According to an embodiment of the present disclosure, the curvature radiuses of the base 120 and the tip 110 may have a ratio greater than 3:1.

By having a tiny tip formed on a relatively larger base, the particle source 100 may produce lens effect, and thus obtain a very small beam opening angle. According to an embodiment of the present disclosure, beams of particles may be constrained within a very narrow beam opening angle, and this may greatly increase the beam current density.

The particle source having the above configuration, when used as an electron source, may give an improved evenness of electron energy, because the source has high utilization of current, and reduced total amount of charges and thus Coulomb repulsion force in a space. Optionally, when the particle source having the above configuration is used as an electron source, there may be only one atom at the topmost part of the tip 110. In this way, the generated electron beams may have good coherence among electrons.

Figure 2A:
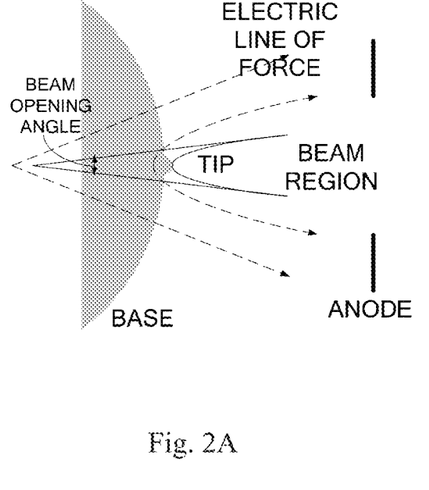
FIGS. 2A and 2B show schematic diagrams of a particle source according to an embodiment of the present disclosure and a prior art pyramid-shaped particle source, respectively, when they are used as an electron source.
Figure 2B:
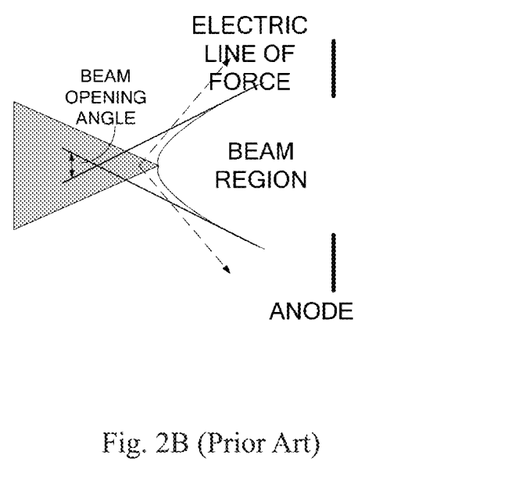

FIGS. 2A and 2B show schematic diagrams of the particle source 100 according to an embodiment of the present disclosure and a prior art pyramid-shaped particle source (U.S. Pat. No. 7,368,727 B2), respectively, when they are used as an electron source. It can be seen that the beam opening angle of the particle source 100 is far smaller than that of the pyramid-shaped particle source, and accordingly the former may have a far greater scale of current through an extraction electrode than the latter.

Figures 2C, 2D:
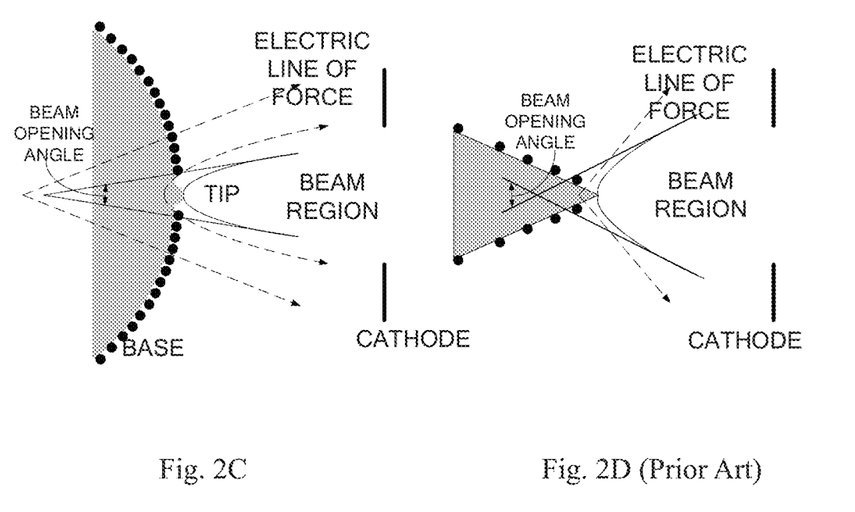
FIGS. 2C and 2D show schematic diagrams of a particle source according to an embodiment of the present disclosure and a prior art pyramid-shaped particle source, respectively when they are used as an ion source.

The particle source having the above configuration when used as an ion source may achieve a large current, because the base has a relatively large surface area, and may attract more gas to be provided to the tip. FIGS. 2C and 2D show schematic diagrams of the particle source 100 according to an embodiment of the present disclosure and the prior art pyramid-shaped particle source, respectively, when they are used as an ion source. It can be seen that with a virtual source total size, the particle source 100 may have a much larger base surface area than the pyramid-shaped particle source, and therefore may attract more gas for generating greater ion current.

Figure 3:
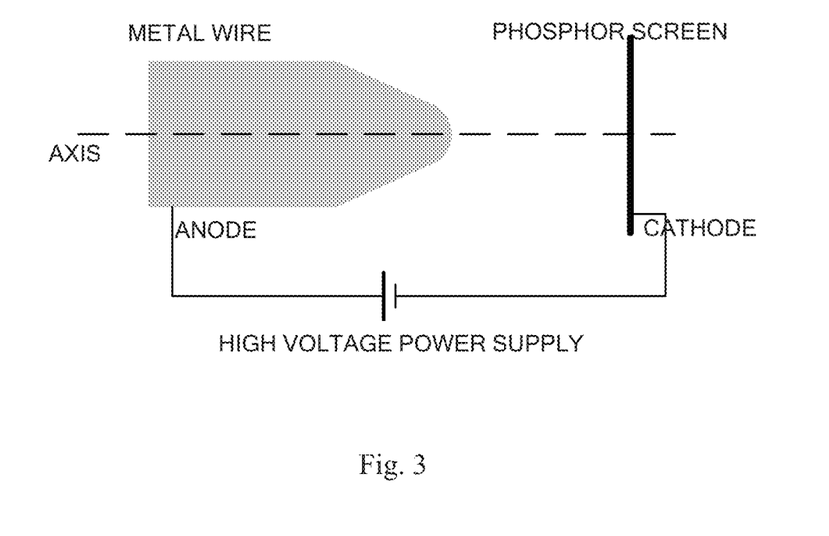
FIG. 3 shows a schematic diagram of an apparatus for manufacturing a particle source according to an embodiment of the present disclosure.

FIG. 3 shows a schematic diagram of an apparatus for manufacturing a particle source according to an embodiment of the present disclosure. As shown in FIG. 3, a metal wire is placed and cooled in a vacuumed space. Then, active gas is introduced into the space, and a positive high voltage V is applied to the metal wire.

The metal wire may be made of metals with high melting point (e.g., having a melting point higher than 2200° C.), such as tungsten (W), tantalum (Ta), rhenium (Re), molybdenum (Mo), hafnium (Hf), or niobium (Nb). The cooled metal wire may absorb the active gas at its surface, and optionally may have an etching zone (described later) of a suitable width. The active gas may be any one of $O_2$, $N_2$, CO, $CO_2$, other active gas containing oxygen or nitrogen, or combination thereof. The active gas may have such pressure that FICE may be performed at an appropriate speed. For the active gas, its pressure may be less than its discharge pressure. The positive high voltage V may bring an electric field at the top surface of the metal wire head to be greater than the ionization electric field of the active gas, and accordingly produce an etching zone (described later) at a predetermined position of the metal wire.

As shown in FIG. 3, the metal wire head (including the base and the tip) may optionally have an axisymmetric shape. The metal wire may be pre-processed, for example, through electrochemical etching, to have a tapered head with a tip diameter smaller than 1 µm for example. The head may have a radius at an order of nanometers to sub-micrometers, and may optionally have an axisymmetric shape.

The method for manufacturing a particle source according to an embodiment of the present disclosure is a process which combines FICE and field evaporation in a simultaneous manner. The positive high voltage V may produce an etching zone at the metal wire head, and HOE may be performed within this etching zone. The FICE may increases an electric field at the top surface of the metal wire head up to be greater than an electric field for field evaporation of the metal material, so that the metal atoms at the top surface may be evaporated off. After the FICE activates the field evaporation, the positive high voltage V may be preferably a constant positive high voltage, and thus allow mutual adjusting between the FICE and the field evaporation to achieve and maintain a dynamically balanced state. Under such circumstances, the shape of the metal wire head may be changed constantly, until the head may be formed of a large base and a tiny tip on the base. The FICE may occur at the lateral sides of the metal wire head to form the base. The FICE and the field evaporation may be performed at the lateral sides and the upper side of the metal wire head, respectively, to reduce the metal wire head and thereby form the tip. With the above manufacturing method, it is possible to achieve an atom-level accurate control of the tip curvature radius, and a nanometer-level accurate control of the base curvature radius.

The FICE process will be explained first with reference to FIG. 4A. The metal wire may be cooled and placed in a space filled with active gas. A positive high voltage V may be applied to the metal wire to generate an electric field at the surface of the metal wire. The strength of the electric field increases gradually from the tail to the head of the metal wire.

The distribution of the active gas at respective positions of the metal wire surface depends on the electric field strength at these positions. If the electric field strength exceeds the ionization electric field strength ($E_I$) for the gas, the active gas will be ionized at a distance (about 0.4 nm) from the metal wire surface, and thus will not reach the surface in the vacuumed space. As a result, the distribution of active gas in the region having an electric field strength greater than $E_I$ is mainly due to field migration. That is, the active gas absorbed at positions of the metal wire surface where the electric field strength is lower may be forced by the electric field to migrate along the surface from the lower-strength positions to higher-strength positions. Such active gas is closely proximate (within a distance of 0.4 nm) to the metal wire surface, and will not be ionized. During the migration of the active gas toward the head of the tip, the active gas may be constantly consumed, because the FICE will be activated wherever the electric field at the surface exceeds a threshold field strength $E_C$ for FICE, which may cause the consumption of the active gas. As a result, the concentration of the active gas at the metal wire surface is decreased with an increase of the electric field (from the tail to the head of the tip). The active gas may be distributed up to a highest position where the etching is activated, i.e., a position corresponding to an electric field strength $E_{up}$. The region between the position of the strength $E_C$ and the highest position of $E_{up}$ may be defined as an etching zone. The threshold field strength $E_C$ depends on material for the metal wire and composition of the active gas.

The speed and accuracy of the FICE are influenced by the amount of active gas absorbed at the metal wire surface and the migration speed of active gas along the surface.

The etching speed is incremented with the amount of active gas absorbed at the metal wire surface. The greater the concentration of the introduced active gas (i.e., the greater the pressure intensity) is, the more active gas is absorbed at the metal wire surface, and the greater the etching speed is. In addition, it is easier for active gas to be absorbed at the metal wire surface with a lower temperature. However, lowering the temperature may reduce the migration speed of active gas along the surface, and thus reduce the etching speed. Further, it is easier for the metal wire surface to absorb the active gas if the electric field at the surface is stronger. A person skilled in the art will appreciate that the etching accuracy may decrease at a higher etching speed. Therefore, the etching speed and accuracy may be regulated in accordance with practical applications by adjusting the pressure of the introduced active gas, the temperature of the metal wire and the value of the positive high voltage V.

The etching speed increases with an increase in the migration speed of active gas along the surface. The migration speed primarily depends on (1) the gradient distribution of the electric field along the metal wire surface, which mainly depends on the geometry of the surface, the attributes of the metal material and the like: and (2) the kinetic energy of the active gas. The quantity of kinetic energy of the active gas absorbed at the surface may be changed by adjusting the temperature of the metal wire, thereby changing the migration speed of the active gas.

The lower the temperature of the metal wire is, the lower the migration speed of the active gas is, and the narrower the etching zone is. Accordingly, the controllable etching accuracy will become higher, but the etching speed is reduced. On the contrary, the higher the temperature of the metal wire is, the wider the etching zone is. Accordingly, the etching accuracy will be reduced, but the etching speed is increased. Therefore, by controlling the temperature of the metal wire, it is possible to control the process of FICE to achieve desired etching speed and accuracy.

Figure 4A:
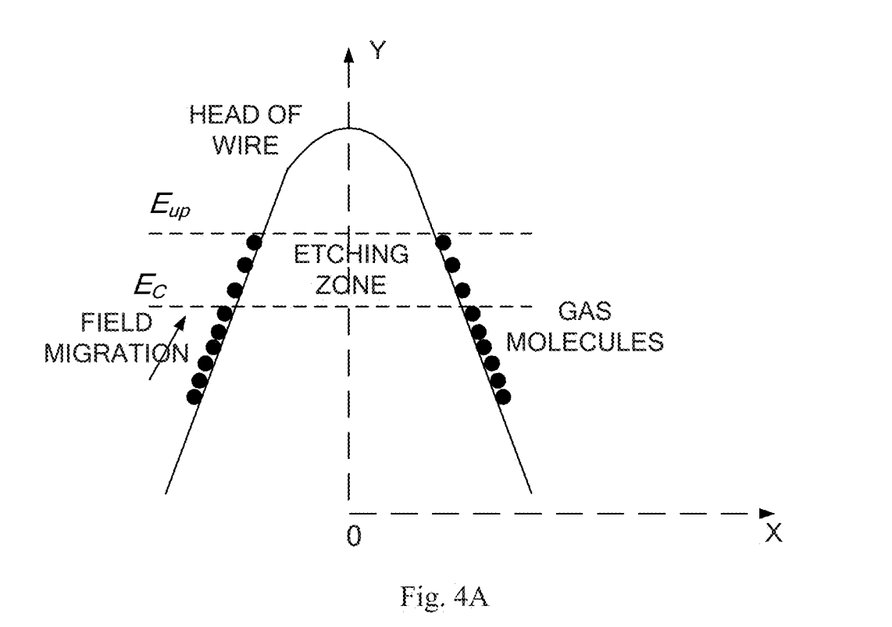
FIGS. 4A-4C show a method for manufacturing a particle source according to an embodiment of the present disclosure.
Figure 4B:
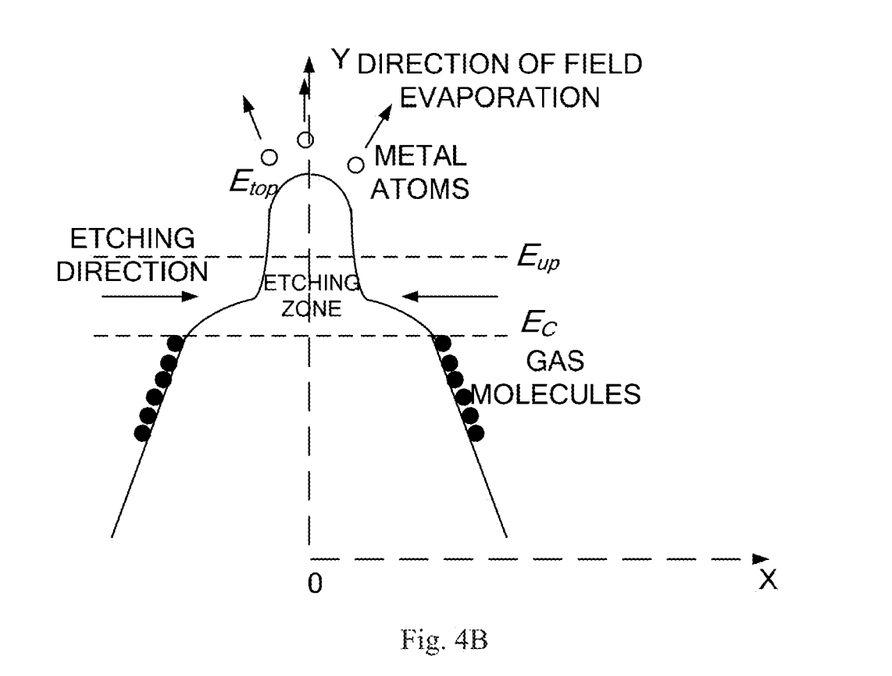

As shown in FIG. 4A, at the beginning of etching, a positive voltage V is selected sufficiently high so that the strength of an electric field at the top of the metal wire exceeds the ionization electric field strength ($E_I$) for gas, and thus there is no active gas at the top. Accordingly, an etching zone will be formed at a distance from the top of the metal wire. An appropriate positive high voltage may be selected according to the curvature radius of the head of the metal wire. In an embodiment of the present disclosure, the positive high voltage V may be between 3 kV and 100 kV. During the process of etching, the active gas may continuously etch the lateral sides of the metal wire, which will increase the curvature of the etch zone and form a base having a gently-shape top as shown in FIG. 4B. Particularly, the active gas may be bound to atoms of the metal surface, and this may reduce the binding force between the surface atoms and their neighboring atoms. With application of the strong electric field, the binding of the active gas and the metal atoms are evaporated off from the metal surface. This process is called as FICE.

Next the field evaporation will be described with reference to FIG. 4B. Along with the occurrence of the FICE, the curvature radius of the metal wire top portion above the etching zone is decreased so that the electric field $E_{top}$ at the top is being increased. When $E_{top}$ is increased to be above the field evaporation electric field $E_P$ for the metal material, the metal atoms of the metal wire top will be directly pulled out of the metal surface by the strong electric field. This process is called field evaporation. Therefore, the FICE reduces the head of the metal wire constantly from the lateral sides of the wire, while the field evaporation reduces the head constantly from the upper side.

Figure 4C:
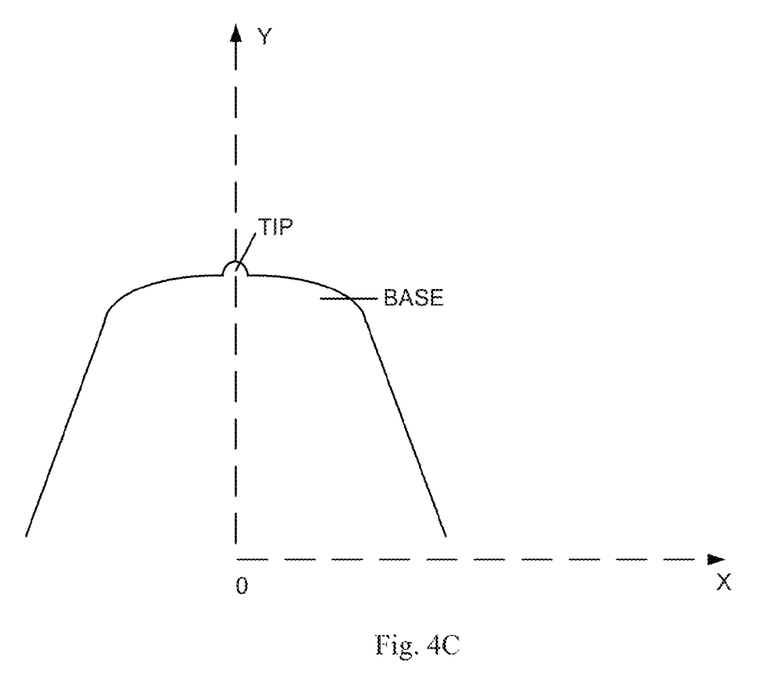

With the FICE and the field evaporation being performed, the head of the metal wire is gradually decreased in size. When the head is reduced into an expected shape, the FICE and the field evaporation are stopped, and a particle source having a large base and a tiny tip is obtained as shown in FIG. 4C. After stopping the HOE and the field evaporation and discharging the active gas, another positive high voltage may be applied to activate field evaporation at the topmost layer of the surface, which will remove any non-metal atom or molecule (e.g., the molecule of the active gas) absorbed at the tip, and also selectively remove some metal atoms in order to produce a tip having a predetermined number of atoms at the topmost layer.

According to an embodiment of the present disclosure, during the process of shaping the head of the metal wire, the migration speed of the active gas along the metal wire surface may be optionally decreased by quickly lowering the temperature of the metal wire to below the boiling point of the active gas. Then, the positive high voltage may be turned off to stop the FICE and the field evaporation. Alternatively, the introduction of the active gas may be stopped before lowering the temperature of the metal wire and turning off the voltage. After turning of the voltage, the temperature of the metal wire may be increased to an appropriate point (e.g., above the melting point of the active gas; in an embodiment, the temperature may be selected around the room temperature 300K) to remove any possible active gas molecule absorbed at the surface.

According to an embodiment of the present disclosure, at a constant positive high voltage, mutual adjusting occurs between the FICE and the field evaporation to achieve and maintain a dynamically balanced state. The FICE leads to an increase in the curvature radius of the etching zone, and thus a decrease in the electric field. At the same time, the size of the central region of the head will be reduced, leading to reduction in the curvature radius and increase in electric field. This will activate the field evaporation. The field evaporation in turn increases the curvature radius of the size of the central region of the head, and decreases the size of the central region along a longitudinal direction. Since the surface electric field at the central region is always maintained at the field evaporation electric field $E_p$, the change in the geometry of the central region may narrow the difference of electric fields at the bottom and at the head. This may in turn lead to an increase in the electric field at the base. To be noted, the electric field at the base may have an overall tendency of gradual decreasing. When the electric field at some area of the base decreases to be less than $E_C$, the FICE is stopped at this area.

The processes of FICE and field evaporation may be observed by introducing imaging gas. A conductive fluoroscopic screen may be positioned directly before the metal wire. The imaging gas may be inert gas, such as He, Ne and the like. Under a strong electric field generated by a high voltage, the molecules of the imaging gas may be polarized and attracted by the tip. Upon arriving at the head of the tip, the molecules may be ionized and then bombarded onto the fluoroscopic screen. Such bombardment may generate bright spots on the screen, each spots for an image of one atom. In this way, the state of the metal wire head may be observed. According to an embodiment of the present disclosure, a micro-channel plate (MCP) may be positioned between the metal wire and the screen to facilitate the imaging process.

By observing the state of the metal wire head, it is possible to stop FICE and field evaporation at the exact time of achieving the desired shape of the particle source, and thus control the shape in a more accurate manner. According to an embodiment of the present disclosure, after stopping the FICE and field evaporation, only field evaporation may be used to accurately control the number of atoms at the topmost layer of the tip. In particularly, a tip having only one atom at the topmost layer may be obtained, and an electron source with such tip may have good spatial coherence. However, a person skilled in the art will appreciate that the above-mentioned observation process is not necessary to the present disclosure, and may be omitted if relevant process parameters could be experimentally determined.

According to an embodiment of the present disclosure, it is possible to accurately control the curvature radiuses of the tip and the base ($R_{Tip}$ and $R_{Base}$, respectively). As described above, the positive high voltage V is maintained at a constant value during the etching process. Once the FICE activates the field evaporation, a mutual adjustment between the FICE and the field evaporation is achieved. At this time, by observing and monitoring how the tip changes, it is possible to immediately stop the FICE and the field evaporation when the particle source has obtained a predetermined shape, and thus accurately control the curvature radius $R_{Tip}$ of the tip up to the atom level.

Once the field evaporation is started, the electric field $E_{top}$ at the topmost layer will be maintained at the field evaporation electric field $E_p$ for the metal material. $E_p$ is a constant depending on material and crystallographic plane. For facilitating the description, a parameter, field enhancement factor $\beta$, may be introduced. The parameter $\beta$ is commonly used in the field of field ion and field emission microscopes. The parameter $\beta$ may be defined as $$E_{top}=E_P=V/\beta, \text{ that is, } \beta=V/E_P \tag{1}$$

$\beta$ depends on a distance d from the tip to the phosphor screen, and the curvature radiuses of the tip and the base ($R_{Tip}$ and $R_{Base}$, respectively). $\beta$ may be denoted as a function of $$\beta=\beta(d,R_{Base},R_{Tip}) \tag{2}$$

In manufacture, the region where the FICE and the field evaporation occur may have a size of a micrometer order, which is substantially less than the value of d (of a centimeter order) in a conventional field ion microscope. Therefore, d may be considered as constant, and omitted from the above equation (2). Further, since $R_{Tip}$ is substantially less than $R_{Base}$, the equation (2) may be rewritten as $$\beta=\beta_1(R_{Base})\beta_2(R_{Tip}) \tag{3}$$

$\beta_1$ ($R_{Base}$) and $\beta_2$ ($R_{Tip}$) are field intensify factors for the base and the tip and depend on their curvature radiuses, respectively.

By combining the equations (1) and (3), it may be derived as $$\beta_1(R_{Base}) = \frac{V}{E_P \times \beta_2(R_{Tip})} \tag{4}$$

As above described, it is possible to accurately control $R_{Tip}$ and thus $\beta_2$ ($R_{Tip}$), and $E_p$ depends on material. Therefore, $\beta_1$ ($R_{Base}$) and thus $R_{Base}$ may be accurately controlled by adjusting the value of the voltage V.

Hereafter, the method for manufacturing the particle source according to an embodiment of the present disclosure will be described taking a single-crystalline tungsten wire (<111> orientated) as example. The method includes cooling the tungsten wire to a temperature of 10K-200K, such as 90K, and introducing active gas $O_2$, which may have a pressure range from $10^{-6}$ to 0.1 Pa. The method further includes applying a positive high voltage V of 3 kV-100 kV (e.g., 5 kV) to the tungsten wire. By further introducing imaging gas He, the state of the head of the tungsten wire may be observed on a phosphor screen directly facing the tungsten wire. A particle source of a shape shown in FIG. 1 may be produced through FICE and field evaporation.

As above described, it is possible to observe the state of the tip on a phosphor screen, and thus accurately control the number of atoms of the tip. When the number of atoms at the topmost layer of the tip reaches a required value, the temperature of the tip may be lowered to below the boiling point of $O_2$ (here, 30K), and the positive high voltage may be turned off to stop FICE and field evaporation. In this way, a particle source is produced having a desired shape. Thereafter, the temperature of the tip may be appropriately increased, for example, to 300K, in order to remove $O_2$ molecules absorbed at the surface. To be noted, after FICE and field evaporation, there may be some non-metal atoms or molecules (e.g., active gas molecules) absorbed at the surface of the tip. It is possible to remove such atoms or molecules by controlling only the field evaporation, and also selectively remove metal atoms to reach a predetermined number of atoms at the topmost layer of the tip. The number may be at least one.

The above example is only for illustration other than limiting the present disclosure. The metal wire may be made of metals with high melting point, such as tungsten (W), tantalum (Ta), rhenium (Re), molybdenum (Mo), hafnium (Hf), or niobium (Nb). For any metal material, the positive high voltage may be controlled so that the surface electric field of the metal wire head is greater than the ionization electric field of the active gas. The pressure of the active gas may be controlled to be lower than its discharge pressure, and the cooling temperature for the metal temperature may be controlled so that the molecules of the active gas can be absorbed to the surface of the metal wire. Preferably, the voltage V may be kept constant after the FICE and the field evaporation are activated.

For example, in the case of active gas $O_2$, the pressure of the gas may be controlled in the range from $10^{-6}$ Pa to $10^{-1}$ Pa. For $N_2$, the pressure of the gas may be controlled in the range from $10^{-6}$ Pa to $10^{-2}$ Pa. For CO, the pressure of the gas may be controlled in the range from $10^{-6}$ Pa to $10^{-1}$ Pa.

For example, in the case of active gas $O_2$, the temperature of the metal wire may be controlled in the range from 10K to 200K. For $N_2$, the temperature of the metal wire may be controlled in the range from 10K to 200K. For CO, the temperature of the metal wire may be controlled in the range from 10K to 200K. The positive high voltage V may take a value between 3 kV and 100 kV.

A person skilled in the art will appreciate that the above values or value ranges are alternative examples only for an easier understanding of the principle and process of the present disclosure, and the present disclosure may also be implemented with other values or value ranges in addition to these examples. FIGS. 5A-5E shows respective states of the head of a tungsten wire at respective stages of a method for manufacturing a particle source according to an embodiment of the present disclosure, by taking single-crystalline tungsten wire as example. In the method, the tungsten wire is cooled to the temperature of 90K, active gas $O_2$ is introduced having a pressure of $1\times10^{-3}$ Pa, and a positive high voltage V of 5 kV is applied.

Figure 5A:
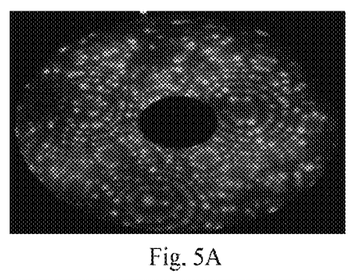
FIGS. 5A-5E show respective states of the head of a tungsten wire at respective stages of a method for manufacturing a particle source according to an embodiment of the present disclosure.
Figure 5B:
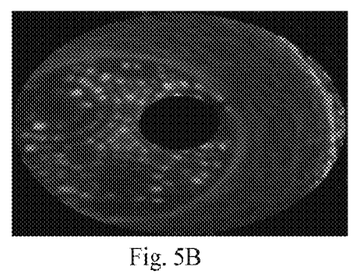
Figure 5C:
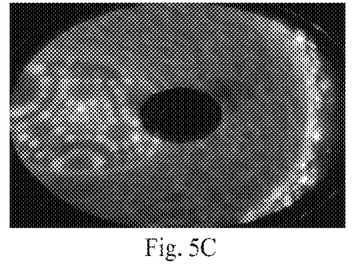
Figure 5D:
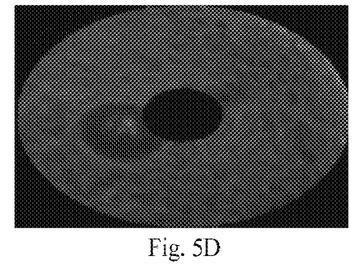
Figure 5E:
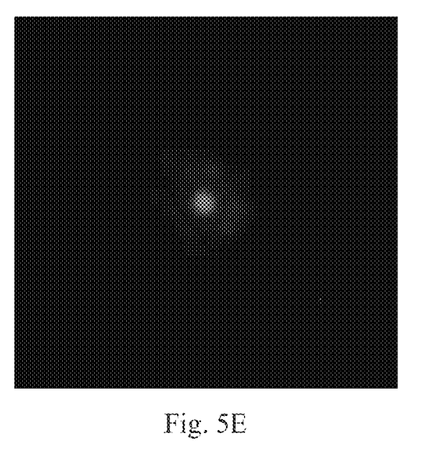

FIG. 5A shows an initial state of the head of the tungsten wire. FIGS. 5B-5d show respective states when the active gas has been introduced for 1 hour, 2 hours and 2.5 hours, respectively. FIG. 5E shows a final state after 3-hour introduction of the active gas. The bright spot in the center of FIG. 5E indicates that the tip has only one atom.

The method according to the present disclosure may be used in manufacturing an electron source for electronic microscope, an ion source for ion microscope, an electron source for electron beam lithography machine, an ion source for ion beam lithography machine, an electron source for micro-focus X ray tube, and particle sources for other purposes. The method according to the present disclosure can accurately control the number of atoms at the tip of the particle source, and the number may reach a minimum of 1.

The method according to the present disclosure can produce a particle source capable of providing particle flux of high beam current density, small beam opening angle, reduced virtual source diameter and small energy spread. An electron source produced according to the present disclosure can emit electron beams with good spatial coherence.

The foregoing description illustrates the principle of the present disclosure with reference to exemplary embodiments. As will be appreciated by a person skilled in the art, the respective details listed above are intended for illustrating other than limiting the present disclosure. The steps included in the above method may be performed in different sequences, as long as the object of the present principle can be achieved. The scope of the present disclosure is defined by the appending claims and equivalents thereof.

What is claimed is:

1. A method for manufacturing a particle source, comprising:
   placing a metal wire in vacuum, introducing active gas, adjusting a temperature of the metal wire and applying a positive high voltage V of from 3 kV to 100 kV to the metal wire to generate at a side of the head of the metal wire an etching zone in which field induced chemical etching (FICE) is performed;
   increasing by the FICE a surface electric field at the top of the metal wire head to be greater than a field evaporation electric field of material for the metal wire, so that metal atoms at the top of the metal wire are evaporated off;
   after the field evaporation is activated by the FICE, causing mutual adjustment between the FICE and the field evaporation, until the head of the metal wire has a shape of combination of a base and a tip on the base; and
   stopping the FICE and the field evaporation when the head of the metal wire takes a predetermine shape.

2. The method of claim 1, wherein the positive high voltage V enables a surface electric field at the top of the head to be greater than an ionization electric field of the active gas.

3. The method of claim 1, wherein the active gas has a pressure lower than a discharge pressure of the active gas.

4. The method of claim 1, wherein during the FICE, the temperature of the metal wire is controlled so that the molecules of the active gas are absorbed to the surface of the metal wire.

5. The method of claim 1, wherein the FICE occurs at lateral sides of the metal wire to form the base, and the FICE and the field evaporation reduce the head of the metal wire from the lateral sides and the upper side, respectively, and then form the tip of the particle source.

6. The method of claim 1, further comprising: decreasing a migration rate of the active gas along the surface of the metal wire by lowering the temperature of the metal wire to below the boiling point of the active gas, and then stopping the FICE and the field evaporation by turning off the positive high voltage V.

7. The method of claim 6, wherein after turning off the voltage, the temperature of the metal wire is increased to remove active gas molecules absorbed to the surface of the metal wire.

8. The method of claim 6, further comprising: stopping the FICE and the field evaporation by stopping introduction of the active gas.

9. The method of claim 1, wherein the FICE and the field evaporation are stopped when a tip is obtained having a predetermined number of atoms at the topmost layer.

10. The method of claim 1, further comprising: after stopping the FICE and the field evaporation and discharging the active gas, applying another positive high voltage to activate field evaporation at the topmost layer of the surface of the tip to remove non-metal atoms or molecules absorbed at the tip, and also to selectively remove metal atoms in order to produce a tip having a predetermined number of atoms at the topmost layer, wherein the predetermined number is at least one.

11. The method of claim 1, wherein the base has a curvature radius of an order ranging from tens of nanometers to micrometers, and the tip has a curvature radius of an order ranging from sub-nanometers to tens of nanometers.

12. The method of claim 1, further comprising: positioning a micro-channel plate (MCP) and a conductive phosphor screen in this order along a direction perpendicular to an axis of the metal wire and directly facing the head of the metal wire, and introducing imaging gas for observing states of the head of the metal wire.

13. The method of claim 1, wherein the positive high voltage V is constant, while the FICE and the field evaporation are occurring simultaneously and adjusting each other.

14. The method of claim 1, wherein the metal wire is preprocessed to have a tapered head.

15. The method of claim 1, wherein accuracy and speed of the FICE is controlled by adjusting one or more of the pressure of the active gas, the temperature of the metal wire and the value of the positive high voltage V.

16. The method of claim 1, wherein the curvature radius of the base is controlled by controlling the curvature radius of the tip and the value of the positive high voltage V.

17. The method of claim 1, wherein the active gas comprises any one of $O_2$, $N_2$, CO, $CO_2$, other active gas containing oxygen or nitrogen, or combination thereof.

18. The method of claim 1, wherein material for the particle source comprises any one of tungsten (W), tantalum (Ta), rhenium (Re), molybdenum (Mo), hafnium (Hf), and niobium (Nb).

* * * * *